US008933424B1

United States Patent
Satoh

(10) Patent No.: US 8,933,424 B1
(45) Date of Patent: Jan. 13, 2015

(54) METHOD FOR MEASURING TRANSVERSE BEAM INTENSITY DISTRIBUTION

(71) Applicant: Axcelis Technologies, Inc., Beverly, MA (US)

(72) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/086,578

(22) Filed: Nov. 21, 2013

(51) Int. Cl.
*H01J 37/317* (2006.01)
*H01J 49/10* (2006.01)
*H01L 21/265* (2006.01)
*H01J 37/04* (2006.01)

(52) U.S. Cl.
CPC .............. *H01J 37/04* (2013.01); *H01J 37/3171* (2013.01); *H01J 2237/2482* (2013.01); *H01J 2237/303* (2013.01); *H01J 2237/30472* (2013.01)
USPC ............... 250/492.21; 250/492.2; 250/423 R; 250/424; 250/396 R; 250/397; 118/712; 427/8; 427/523

(58) Field of Classification Search
CPC ................ H01J 37/3171; H01J 37/244; H01J 2237/24542; H01J 37/147; H01J 2237/24507; H01J 2237/24514; H01J 2237/24535; H01J 2237/31703; H01J 37/243
USPC .......... 250/492.21, 492.2, 423 R, 424, 396 R, 250/397; 118/712; 427/8, 523
See application file for complete search history.

(56) References Cited

U.S. PATENT DOCUMENTS

| 4,922,105 | A | 5/1990 | Hosoi |
| 7,611,975 | B2 * | 11/2009 | Murrell et al. ................ 438/506 |
| 8,071,964 | B2 * | 12/2011 | Satoh ....................... 250/492.21 |
| 2005/0191409 | A1 * | 9/2005 | Murrell et al. ..................... 427/8 |
| 2011/0042578 | A1 * | 2/2011 | Murrell et al. ................. 250/397 |

* cited by examiner

*Primary Examiner* — Nikita Wells
(74) *Attorney, Agent, or Firm* — Eschweiler & Associates, LLC

(57) ABSTRACT

An ion implantation system and method are provided where an ion source generates an ion and a mass analyzer mass analyzes the ion beam. A beam profiling apparatus translates through the ion beam along a profiling plane in a predetermined time, wherein the beam profiling apparatus measures the beam current across a width of the ion beam concurrent with the translation, therein defining a time and position dependent beam current profile of the ion beam. A beam monitoring apparatus is configured to measure the ion beam current at an edge of the ion beam over the predetermined time, therein defining a time dependent ion beam current, and a controller determines a time independent ion beam profile by dividing the time and position dependent beam current profile of the ion beam by the time dependent ion beam current, therein by cancelling fluctuations in ion beam current over the predetermined time.

18 Claims, 3 Drawing Sheets

METHOD FOR MEASURING TRANSVERSE BEAM INTENSITY DISTRIBUTION

FIELD OF THE INVENTION

The present invention relates generally to ion implantation systems, and more specifically to dosimetry system method for measuring a time-independent ion beam current profile.

BACKGROUND OF THE INVENTION

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

Typical ion implantation systems include an ion source for generating electrically charged ions from ionizable source materials. The generated ions are formed into a high speed beam with the help of a strong electric field and are directed along a predetermined beam path to an implantation end station. The ion implanter may include beam forming and shaping structures extending between the ion source and the end station. The beam forming and shaping structures maintain the ion beam and bound an elongated interior cavity or passageway through which the ion beam passes en route to the end station. During operation, this passageway is typically evacuated in order to reduce the probability of ions being deflected from the predetermined beam path as a result of collisions with gas molecules.

It is common for the workpiece being implanted in the ion implantation system to be a semiconductor wafer having a size much larger than the size of ion beam. In most ion implantation applications, the goal of the implantation is to deliver a precisely-controlled amount of a dopant uniformly over the entire area of the surface of the workpiece or wafer. In order to achieve the uniformity of doping utilizing an ion beam having a size significantly smaller than the workpiece area, a widely used technology is a so-called hybrid scan system, where a small-sized ion beam is swept or scanned back and forth rapidly in one direction, and the workpiece is mechanically moved along the orthogonal direction of the scanned ion beam. A special form of a hybrid scan, for example, is a so-called DC ribbon beam scan system, in which the scan frequency is theoretically raised infinitely high in order to form a generally continuous DC beam.

In a typical hybrid scan ion implanter, scan frequencies in the two orthogonal directions are quite different, in a way that is similar to the raster scan on a conventional CRT television screen. In the mechanical motion direction of a hybrid scan ion implanter, for example, the scanning motion repeats in a sub-Hz frequency, typically 0.5 Hz as a maximum repetition rate, whereas in the ion beam scan direction, the scanning frequency is as high as 1 KHz.

One of the attractions of a hybrid scan system is that the final doping uniformity on the workpiece is controlled independently in the two orthogonal directions. Once beam current density in the beam scan direction is made uniform, simply moving the workpiece at constant speed in the orthogonal direction will provide the desired 2-dimensional, or 2-D, uniformity. Even if ion beam current fluctuates during the workpiece motion, the speed of the workpiece can be varied accordingly to yield the desired uniformity, assuming the uniformity in the beam scan direction stays in an acceptable range.

Non-uniformity in the beam scan direction results from a non-linearity of the beam scan and optics associated the ion beam formation mechanism. An analogy is a paint spray can that is located at a fixed point from a wall, where the spray can pivots left to right at a constant angular velocity. At constant angular velocity, wall areas far from the spray can receive thinner paint coverage than the area in directly in front of the spray can. In this analogy, the changing distance from the spray can to the wall area is a source of non-linearity in paint coverage.

To obtain uniform beam distribution in the ion beam scan direction of an ion implantation system, the degree of uniformity has to be first measured, and then appropriate correction is made to correct non-uniformities. In the spray paint analogy, once the non-uniformity of the paint is known, angular velocity of spray can is modified so that the spray can slows down as it sprays farther from the center.

However, since the goal of the uniformity in an ion implantation is less than one percent non-uniformity, there are many difficult aspects in attaining uniformity. One difficulty is reliably measuring the uniformity in the beam scan direction under the presence of beam current fluctuations in time. Since measuring beam uniformity is intended to establish a time-independent variation of beam intensity along the beam position, beam fluctuations in time pose substantial difficulties.

SUMMARY OF THE INVENTION

The present disclosure presently appreciates that in order to adequately establish a time-independent ion beam profile, a measured profile depends not only on an intensity distribution in space, but quite often also depends on a variation of the total ion beam current in time that may occur during the serial measurement of the profile.

Thus, the present disclosure overcomes the limitations of the prior art by providing a system, apparatus, and method for determining a time-independent profile of an ion beam. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation system and method for determining a time-independent profile of an ion beam. In accordance with one exemplary aspect, the ion implantation system comprises an ion source configured to generate an ion beam having an ion beam current associated therewith. The ion beam, for example, comprises a spot beam, a pencil beam, a scanned pencil beam, or a ribbon beam. A mass analyzer if further provided and configured to mass analyze the ion beam.

According to one example, a beam profiling apparatus is configured to translate through the ion beam along a profiling plane within a predetermined time. The beam profiling apparatus is further configured to measure the ion beam current across a width of the ion beam concurrent with the translation, therein defining a position dependent beam current profile of the ion beam. A beam current monitoring apparatus, for example, is further positioned along the beamline (e.g., upstream of the beam profiling apparatus), wherein the beam monitoring apparatus is configured to measure the ion beam current at an edge of the ion beam concurrent with the duration of beam profiling measurement, therein defining a time dependent ion beam current at a fixed point.

The two current measurements, one on the beam profiling apparatus and the other from the beam monitoring apparatus, for example, are synchronized and sampled concurrently. Thus, in accordance with the present disclosure, beam currents can be attained from the beam profiling apparatus and beam monitoring apparatus for each sample time as the beam profiling apparatus traverses the width of the ion beam. Accordingly, a time-independent ion beam profile can be more closely approximated by normalizing the series of beam current data from the beam profiling apparatus by the corresponding data from the beam monitoring apparatus. In one example, the time-independent ion beam profile can be attained, by dividing the current attained from the beam profiling apparatus by the current attained from the beam monitoring apparatus for each sample time. Accordingly, fluctuations in ion beam current over the predetermined time are cancelled, therein providing a time-independent ion beam profile. The present disclosure contemplates various other methods of normalization, such as by fitting a series of readings from the beam monitoring apparatus with a function and normalizing the data from the beam profiling apparatus to a fitted curve.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
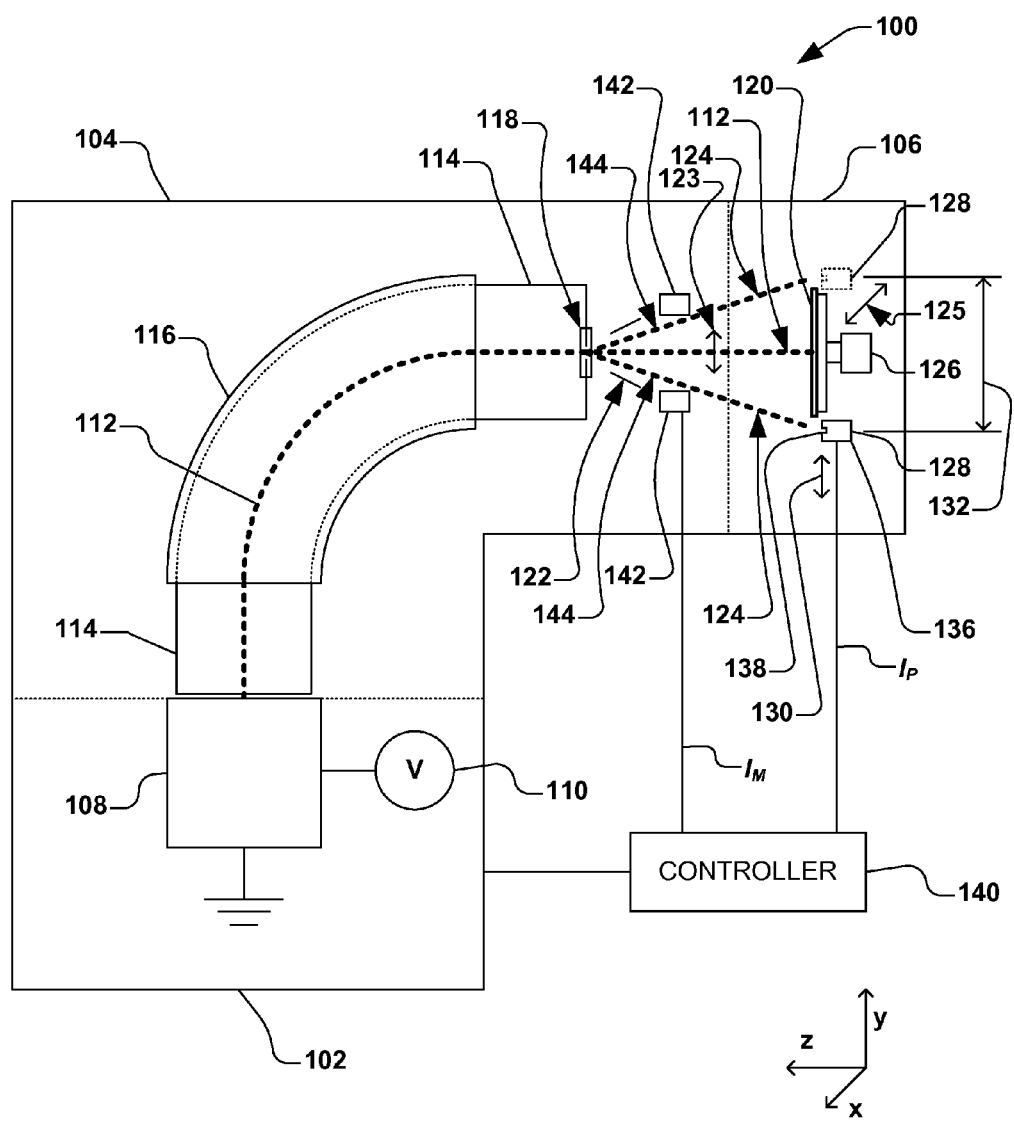
FIG. 1 illustrates a block diagram of an ion implantation system according to one exemplary aspect of the present disclosure.

The present invention is directed generally toward a system, apparatus, and method for determining a time-independent profile of an ion beam. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

In order to adequately establish a time-independent profile of an ion beam, the present disclosure appreciates that a measured profile depends not only on an intensity distribution in space, but quite often also on a variation of the total ion beam current in time that may occur during a serial measurement of the profile. Regardless of how precisely the ion beam is controlled, ion beam current is not typically constant due to various factors. Variation of an ion beam scan can cover a wide frequency spectrum, from very high frequency (e.g., up to several hundreds of KHz), down to a very slow variation, usually called "drift", of sub-Hz frequency with an amplitude varying up to tens of percent.

One conventional method for measuring the non-uniformity in a beam scan direction is to mechanically traverse a narrow width Faraday cup (also called a travelling faraday cup) to measure beam density variation (a so-called "beam profile") along the beam scan direction for the entire width of the scanned ion beam, such as described in U.S. Pat. No. 4,922,106 to D. W. Berrian et al. Although this method of utilizing a travelling Faraday cup is widely or almost exclusively used in ion implanters having hybrid scan systems, the method encounters a difficulty in extracting time-independent non-uniformity information when ion beam intensity fluctuates in time.

Due to the ever-present fluctuation of beam current, the beam current measurement is averaged for a so-called "integration time", typically tens of milliseconds. Because of this integration time, any beam current fluctuation of which a half-period is shorter than the integration time is attenuated. For example, for an integration time of 20 msec, beam fluctuations above 25 Hz can be safely ignored.

With the travelling Faraday cup, however, variations in ion beam uniformity appears as a variation in time-series readings as the traveling Faraday cup travels from one end of the scanned ion beam to the other. One problem presently appreciated is that if beam current intensity also changes during this period, there is no way to distinguish the variation in beam current in time from the intended "time-independent" variation by the position of the beam. As an example, assuming the travelling Faraday cup moves at 10 cm/sec, if the ion beam intensity fluctuates at 10 Hz, the 10 Hz fluctuation will appear as an increase and decrease of the ion beam intensity in a 1 cm period, even as the "time-independent" ion beam distribution is perfectly uniform.

Heretofore, the way to distinguish the two types of variations has been to repeat the measurements several times in order to cancel out the time varying components, assuming they will not be in synchronization with the motion of the travelling Faraday cup. However, under productivity pressures, repeating such a measurement several times is typically not a desirable option.

Accordingly, the present disclosure is directed toward providing a true "time-independent" ion beam profile under time-varying ion beam current conditions without the need of repeating the profile measurements.

Referring now to the figures, FIG. 1 illustrates an exemplary ion implantation system 100 having a terminal 102, a beamline assembly 104, and an end station 106. The terminal 102, for example, comprises an ion source 108 powered by a high voltage power supply 110, wherein the ion source produces and directs an ion beam 112 through the beamline assembly 104, and ultimately, to the end station 106. The ion beam 112, for example, can take the form of a spot beam, pencil beam, ribbon beam, or any other shaped beam. The beamline assembly 104 further has a beamguide 114 and a mass analyzer 116, wherein a dipole magnetic field is established to pass only ions of appropriate charge-to-mass ratio through an aperture 118 at an exit end of the beamguide 114 to a workpiece 120 (e.g., a semiconductor wafer, display panel, etc.) positioned in the end station 106.

In accordance with one example, an ion beam scanning mechanism 122, such as an electrostatic or electromagnetic scanner (referred to generically as a "scanner"), is configured to scan the ion beam 112 in at least a first direction 123 (e.g., the +/−y-direction, also called a first scan path or "fast scan" axis, path, or direction) with respect to the workpiece 120, therein defining a ribbon-shaped ion beam or scanned ion beam 124. Furthermore, in the present example, a workpiece scanning mechanism 126 is provided, wherein the workpiece scanning mechanism is configured to selectively scan the workpiece 30 through the ion beam 112 in at least a second direction 125 (e.g., the +/−x-direction, also called a second scan path or "slow scan" axis, path, or direction). The ion beam scanning system 122 and the workpiece scanning system 126, for example, can be instituted separately, or in conjunction with one another, in order to provide the desired scanning of the workpiece relative to the ion beam 112. In another example, the ion beam 112 is electrostatically scanned in the first direction 123, therein producing the scanned ion beam 124, and the workpiece 120 is mechanically scanned in the second direction 125 through the scanned ion beam 124. Such a combination of electrostatic and mechanical scanning of the ion beam 112 and workpiece 120 produces what is called a "hybrid scan". The present invention is applicable to all combinations of scanning of the workpiece 120 relative to the ion beam 112, or vice versa.

According to another example, a beam profiling apparatus 128 is provided along the path of the ion beam 112 in order to measure a distribution of one or more properties (e.g., ion beam current) of the ion beam along the first direction 123. The beam profiling apparatus 128 can be provided upstream or downstream of the workpiece 120, wherein the beam profiling apparatus is configured to sense the one or more properties of the ion beam 112 (e.g., the ion beam current) when the ion beam does not intersect the workpiece. The beam profiling apparatus 128, for example, is configured to translate through the ion beam along a profiling plane 130 (e.g., in the first direction 123) in a predetermined time t, wherein the beam profiling apparatus is configured to measure the beam current distribution across a width 132 of the ion beam 112 concurrent with the translation, therein defining profiled beam current $I_P$ (e.g., a time- and position-dependent beam current profile) of the ion beam.

The beam profiling apparatus 128, for example, comprises a Faraday cup 136 (also called a "profile cup"), wherein the Faraday cup in one example comprises a narrow slit 138 directed upstream (e.g., facing the ion beam 112), and is configured to be traversed along the first direction 123 across the entire width of ion beam in order to attain the profiled beam current $I_P$ of the ion beam. Accordingly, the Faraday cup 136 is thus configured to provide the time- and position-dependent profiled beam current $I_P$ to a controller 140. The controller 140, for example, is configured to control and/or send and receive signals to at least one or more of the ion source 108, high voltage power supply 110, beamguide 114, mass analyzer 116, ion beam scanning mechanism 122, workpiece scanning mechanism 126, and the beam profiling apparatus 128.

In accordance with another aspect of the disclosure, a beam monitoring apparatus 142 (e.g., one or more Faraday cups) is further positioned upstream or downstream of the beam profiling apparatus 128, wherein the beam monitoring apparatus is configured to measure the ion beam current over the predetermined time t (e.g., continuously, synchronously, and/or concurrent with the translation of the Faraday cup 136), therein defining a monitored beam current $I_M$ (e.g., a time-dependent ion beam current profile). For example, the beam monitoring apparatus 142 is configured to measure the ion beam current at an edge 144 of the ion beam 112 (e.g., the scanned ion beam 124). The beam monitoring apparatus 142 is generally positioned outside of the path of the ion beam 112 that intersects the workpiece 120, while still being operable to provide a relative current of the ion beam at the edge 144 of the ion beam. The beam monitoring apparatus 142, for example, comprises one or two narrow Faraday cups (also called "monitor cups") positioned at opposite edges 144 of the ion beam 112, and configured to measure the monitored beam current $I_M$ at the respective edges of the ion beam. Alternatively, the beam monitoring apparatus 142 is contemplated to comprise a DC clamp meter positioned upstream of the ion beam scanning system 122, thus not disrupting a flow of the ion beam 112.

A frequency bandwidth of the monitored beam current $I_M$ measured at the beam monitoring apparatus 142, for example, is arranged similarly or in the same manner as a frequency bandwidth for the profiled beam current $I_P$ measured at the beam profiling apparatus 128. For example, the measurement of the profiled beam current $I_P$ via the beam profiling apparatus 128 and the monitored beam current $I_M$ via the beam current monitoring apparatus 142 are synchronized and sampled concurrently. For example, the profiled beam current $I_P$ from the beam profiling apparatus 128 can be denoted as "$I_{Pn}$" and the monitored beam current $I_M$ from the beam monitoring apparatus can be denoted as "$I_{Mn}$" for each sample time n. Thus, in accordance with the present disclosure, data can be attained from the beam profiling apparatus 128 and beam monitoring apparatus 142 for each sample time n (e.g., $\{(I_{P1}, I_{M1}), (I_{P2}, I_{M2}), \ldots (I_{Pn}, I_{Mn})\}$ as the beam profiling apparatus 128 traverses the width 132 of the ion beam 112.

Thus, according to the present disclosure, a time-independent ion beam profile $I_D$ is closely approximated by normalizing the series of the profiled beam current $I_P$ from the beam profiling apparatus 128 by the corresponding monitored beam current $I_M$ from the beam monitoring apparatus 142. In a simplified example, the time-independent ion beam profile $I_D$ can be attained by dividing $I_P$ by $I_M$ to yield a series as $\{(I_{P1}/I_{M1}), (I_{P2}/I_{M2}), \ldots (I_{Pn}/I_{Mn})\}$. Accordingly, fluctuations in ion beam current over the predetermined time t are cancelled, therein providing the time-independent ion beam profile $I_D$. The present disclosure contemplates various other methods of normalization, such as by fitting a series of readings from the beam monitoring apparatus with a function and normalizing the data from the beam profiling apparatus to a fitted curve.

Figure 2A:
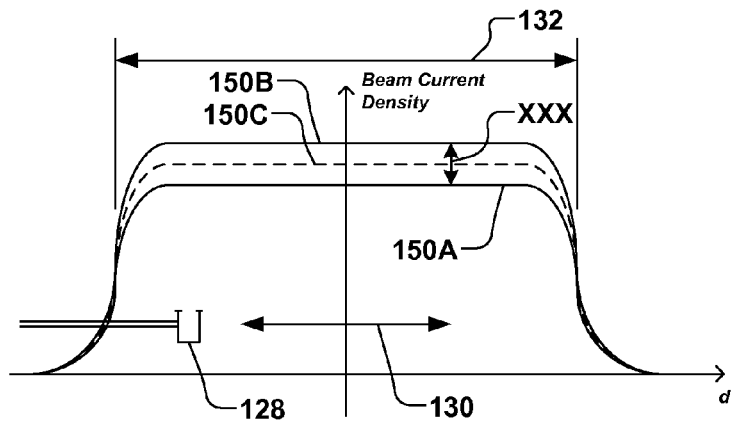
FIG. 2A illustrates an exemplary beam current density fluctuation according to several aspects of the disclosure.
Figure 2B:
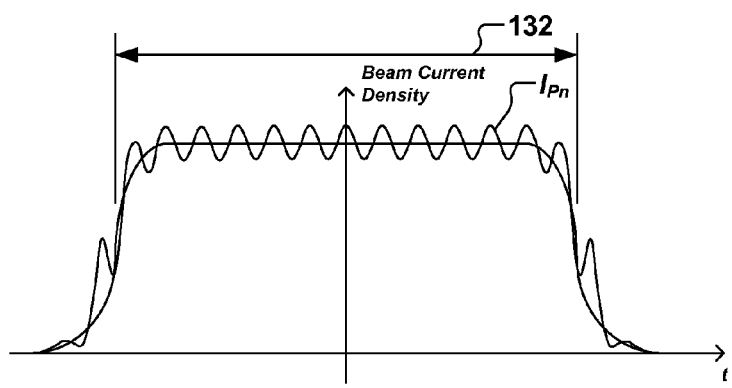
FIG. 2B illustrates an exemplary beam profile measurement fluctuation according to several aspects of the disclosure.

One example will now be described in reference to FIGS. 2A-2D. In FIG. 2A, for example, a total amount of ion beam current I fluctuates in time (e.g., denoted by traces 150A, 150B and fluctuation 152), while the overall beam profile shape (denoted by averaged trace 150C) remains generally unchanged. Such fluctuation 152 is often referred to as "drift". In accordance with the present disclosure, the beam profiling apparatus 128 of FIG. 1, for example, traverses the width 132 of the scanned ion beam 124 and measures the profiled beam current $I_{Pn}$ in equal time steps n, as illustrated in FIG. 2B. In the absence of total beam current fluctuation (e.g., fluctuations associated with the ion source 108, etc.), the obtained data series, $I_{Pn}$, can also be converted to represent the distribution of beam current along the width 132 of the ion beam 112, if the velocity of the motion of the beam profiling apparatus 128 is known. However, due, at least in part, to fluctuations of the total beam current I, the profiled beam current $I_{Pn}$ is modulated, such as illustrated in FIG. 2B.

Figure 2C:
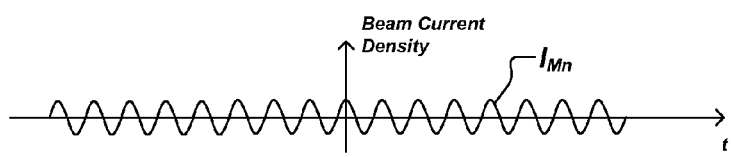
FIG. 2C illustrates an exemplary beam monitoring measurement fluctuation according to several aspects of the disclosure.

Concurrent with the measurement of the profiled beam current $I_{Pn}$, the beam current $I_{Mn}$ measured by the beam monitoring apparatus 142 fluctuates, as illustrated in FIG. 2C, representing the total fluctuation of the ion beam 112 of FIG. 1. Without the monitored beam current $I_{Mn}$ from the beam monitoring apparatus 142 illustrated in FIG. 2C, the profiled beam current $I_{Pn}$ from the beam profiling apparatus 128 of FIG. 2B, alone, cannot discriminate the effect of total beam current fluctuation from the "time-independent" beam profile fluctuation of FIG. 2B.

Figure 2D:
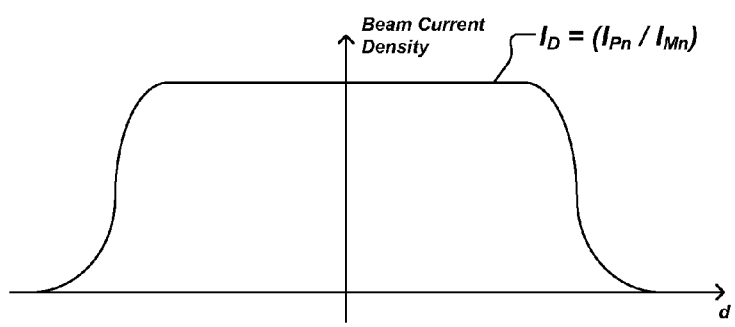
FIG. 2D illustrates an exemplary time-independent beam profile according to several aspects of the disclosure.

Accordingly, the controller 140 of FIG. 1 is thus further configured to synchronously collect data associated with profiled beam current $I_{Pn}$ from the beam profiling apparatus 128 and the monitored beam current $I_{Mn}$ from the beam monitoring apparatus 142, and to determine a time independent ion beam profile $I_D$ illustrated in FIG. 2D. The time independent ion beam profile $I_D$ of FIG. 2D, for example, is determined or normalized by dividing the time and position dependent beam current profile (the profiled beam current $I_{Pn}$ of FIG. 2B) of the ion beam by the time dependent ion beam current profile (the monitored beam current $I_{Mn}$ of FIG. 2C), therein cancelling fluctuations in ion beam current over the predetermined time t. The present disclosure further contemplates various other methods of normalization, such as by fitting a series of readings from the beam monitoring apparatus 142 with a function and normalizing the data from the beam profiling apparatus 128 to a fitted curve.

Figure 3:
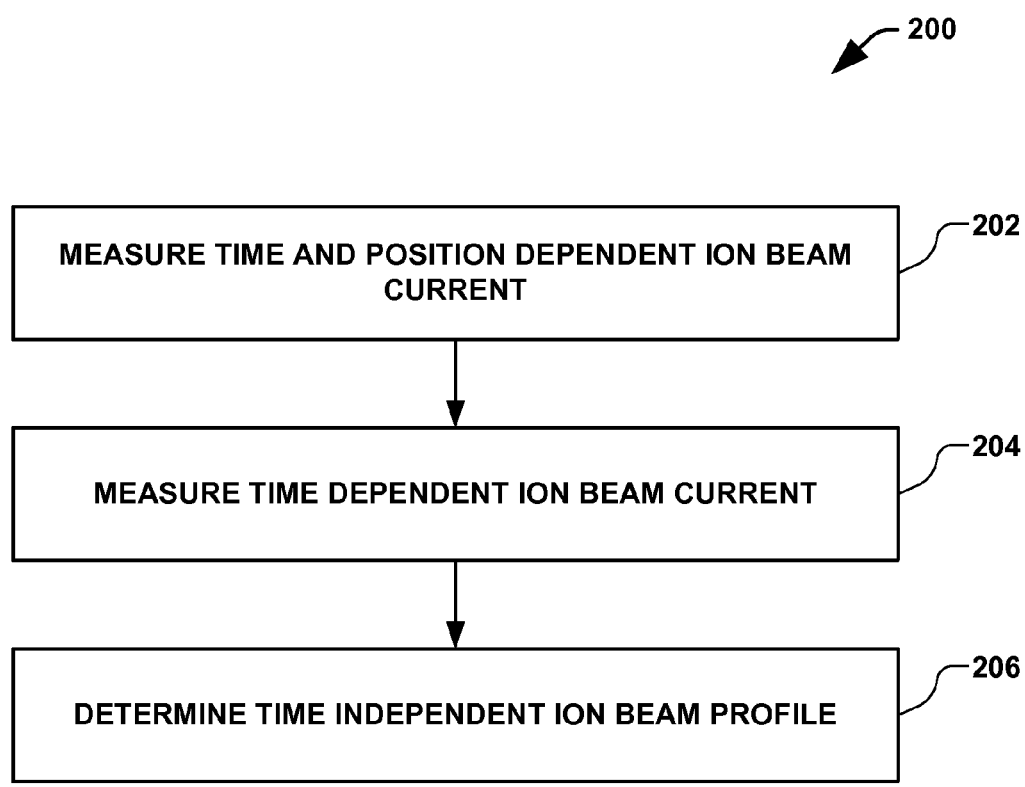
FIG. 3 is a block diagram illustrating an exemplary method for profiling an ion beam in accordance with the present disclosure.

In accordance with another aspect of the present invention, FIG. 3 illustrates an exemplary method 200 for determining a time-independent profile $I_D$ of an ion beam. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 3, the method 200 begins with act 202, wherein a profiled beam current $I_{Pn}$ is measured across a width of the ion beam by translating a beam profiling apparatus through the ion beam in a predetermined time t, therein defining a time- and position-dependent profile of the ion beam. In act 204, a monitored beam current $I_{Mn}$ is measured at an edge of the ion beam over the predetermined time t via a beam monitoring apparatus, therein defining a time-dependent ion beam current. In one example, monitored beam current $I_{Mn}$ is measured at a first edge and a second edge of the ion beam over the predetermined time t via the beam monitoring apparatus. In a preferred embodiment, acts 202 and 204 are synchronously and/or concurrently performed.

In act 206, a time-independent ion beam profile $I_D$ is determined by normalizing the profiled beam current $I_{Pn}$ with the monitored beam current $I_{Mn}$, such as by dividing the time and position dependent profile of the profiled beam current $I_{Pn}$ by the time-dependent monitored beam current $I_{Mn}$, therein by cancelling fluctuations in ion beam current over the predetermined time t.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
   an ion source configured to generate an ion beam having an ion beam current associated therewith;
   a mass analyzer configured to mass analyze the ion beam;
   a beam profiling apparatus configured to translate through the ion beam along a profiling plane in a predetermined time, wherein the beam profiling apparatus is further configured to measure the beam current across a width of the ion beam concurrent with the translation, therein defining a time and position dependent beam current profile of the ion beam;
   a beam current monitoring apparatus, wherein the beam monitoring apparatus is configured to measure the ion beam current of the ion beam over the predetermined time, therein defining a time dependent ion beam current; and
   a controller configured to collect beam current data from the beam profiling apparatus and beam current monitoring apparatus in synchronized time and to determine a time independent ion beam profile by dividing the time and position dependent beam current profile of the ion beam by the time dependent ion beam current, therein by cancelling fluctuations in ion beam current over the predetermined time.

2. The ion implantation system of claim 1, wherein the beam profiling apparatus comprises a Faraday cup.

3. The ion implantation system of claim 1, wherein the Faraday cup comprises a narrow slit through which a portion of the ion beam is permitted to enter.

4. The ion implantation system of claim 1, wherein the beam current monitoring apparatus comprises a Faraday cup having a narrow slit, wherein the Faraday cup is positioned at the edge of the ion beam and configured to measure the ion beam current at the edge of the ion beam.

5. The ion implantation system of claim 4, wherein the beam current monitoring apparatus comprises a pair of Faraday cups respectively positioned at opposite edges of the ion beam and configured to measure the ion beam current at the respective edges of the ion beam.

6. The ion implantation system of claim 1, further comprising a scanner positioned downstream of the mass analyzer and configured to scan the ion beam, therein forming a ribbon-shaped scanned ion beam.

7. The ion implantation system of claim 6, wherein the beam monitoring apparatus is configured to measure the ion beam current at an edge of the ribbon-shaped scanned ion beam.

8. The ion implantation system of claim 6, wherein the beam current monitoring apparatus comprises a first Faraday cup located at a first lateral edge of the ribbon-shaped ion beam and a second Faraday cup located at a second lateral edge of the ribbon-shaped ion beam.

9. The ion implantation system of claim 1, wherein the controller is configured to receive a first ion beam current measurement from the first Faraday cup, a second ion beam current measurement from the second Faraday cup, and to calculate an average ion beam current from the first and second ion beam current measurements, wherein the determination of the time independent ion beam profile is achieved by dividing the time and position dependent beam current profile of the ion beam by the average ion beam current.

10. The ion implantation system of claim 1, wherein the beam current monitoring apparatus is positioned upstream of the beam profiling apparatus.

11. A method for determining a time-independent profile of an ion beam, the method comprising:
 measuring an ion beam current across a width of the ion beam by translating a beam profiling apparatus through the ion beam in a predetermined time, therein defining a time and position dependent profile of the ion beam;
 measuring the ion beam current at an edge of the ion beam over the predetermined time via a beam current monitoring apparatus, therein defining a time dependent ion beam current; and
 calculating a time independent ion beam profile by dividing the time and position dependent profile of the ion beam current by the time dependent ion beam current, therein by cancelling fluctuations in ion beam current over the predetermined time.

12. The method of claim 11, wherein the beam current monitoring apparatus is positioned upstream of the beam profiling apparatus.

13. The method of claim 11, wherein measuring the ion beam current at the edge of the ion beam comprises measuring the ion beam current at a first edge and a second edge of the ion beam over the predetermined time via the beam current monitoring apparatus, and wherein the time dependent ion beam current is defined by averaging the ion beam current measured at the first and second edges of the ion beam.

14. The method of claim 11, wherein the beam current monitoring apparatus comprises one or more Faraday cups having a narrow slit defined therein, wherein the one or more Faraday cups are configured to measure the ion beam current at one or more edges of the ion beam.

15. The method of claim 11, further comprising electrostatically scanning the ion beam, therein defining a ribbon beam.

16. A method of performing dosimetry control in an ion implantation system, comprising:
 generating an ion beam;
 mass analyzing the ion beam;
 scanning the mass analyzed ion beam to form a ribbon-shaped ion beam;
 measuring an ion beam current across a width of the ribbon-shaped ion beam by translating a beam profiling apparatus through the ion beam in a predetermined time, therein defining a time and position dependent profile of the ion beam;
 measuring the ion beam current at an edge of the ribbon-shaped ion beam throughout the predetermined time, therein defining a time dependent ion beam current; and
 calculating a time independent ion beam profile by dividing the time and position dependent profile of the ion beam current by the time dependent ion beam current, therein by cancelling fluctuations in ion beam current over the predetermined time.

17. The method of claim 16 wherein measuring the ion beam current across the width of the ribbon-shaped beam comprises translating a Faraday cup from a first lateral edge of the ribbon-shaped ion beam to a second lateral edge of the ribbon-shaped ion beam and measuring the beam current via the Faraday cup.

18. The method of claim 17, wherein measuring the ion beam current at the edge of the ribbon-shaped ion beam further comprises positioning a first Faraday cup at a first lateral edge of the ribbon-shaped ion beam and a second Faraday cup at a second lateral edge of the ribbon-shaped ion beam opposite the first lateral edge, and measuring a respective first and second beam current thereat, wherein the time dependent ion beam current is further defined as an average of the first and second beam currents.

* * * * *